(12) United States Patent
Brun

(10) Patent No.: US 10,910,118 B2
(45) Date of Patent: Feb. 2, 2021

(54) ELECTRICAL PENETRATION ASSEMBLY FOR A NUCLEAR REACTOR VESSEL

(71) Applicant: SOCIETE TECHNIQUE POUR L'ENERGIE ATOMIQUE, Villiers-le-Bâcle (FR)

(72) Inventor: Michel Brun, Simiane-Collongue (FR)

(73) Assignee: SOCIETE TECHNIQUE POUR L'ENERGIE ATOMIQUE, Villiers-le-Bâcle (FR)

( * ) Notice: Subject to any disclaimer, the term of this patent is extended or adjusted under 35 U.S.C. 154(b) by 432 days.

(21) Appl. No.: 15/738,411

(22) PCT Filed: Jun. 28, 2016

(86) PCT No.: PCT/EP2016/065021
§ 371 (c)(1),
(2) Date: Dec. 20, 2017

(87) PCT Pub. No.: WO2017/001409
PCT Pub. Date: Jan. 5, 2017

(65) Prior Publication Data
US 2018/0190396 A1 Jul. 5, 2018

(30) Foreign Application Priority Data
Jun. 30, 2015 (FR) .................................. 15 56144

(51) Int. Cl.
*G21C 17/116* (2006.01)
*G21C 13/036* (2006.01)
(Continued)

(52) U.S. Cl.
CPC ........ *G21C 17/116* (2013.01); *G21C 13/0285* (2013.01); *G21C 13/036* (2013.01); *G21C 1/32* (2013.01); *Y02E 30/30* (2013.01)

(58) Field of Classification Search
CPC ............................ G21C 13/036; G21C 17/116
See application file for complete search history.

(56) References Cited

U.S. PATENT DOCUMENTS 3,780,204 A * 12/1973 Oliver .................. H01B 17/305
174/11 R
3,801,722 A * 4/1974 Korner ................. G21C 17/116
174/11 R
(Continued)

FOREIGN PATENT DOCUMENTS

FR 2 258 028 A1 8/1975
FR 3 011 134 A1 3/2015
WO WO 2013/158697 A1 10/2013

OTHER PUBLICATIONS

International Search Report as issued in International Patent Application No. PCT/EP2016/065021, dated Sep. 21, 2016.

*Primary Examiner* — Sharon M Davis
(74) *Attorney, Agent, or Firm* — Pillsbury Winthrop Shaw Pittman LLP

(57) ABSTRACT

An electrical penetration assembly for a nuclear reactor vessel, mountable in an aperture of a nuclear reactor vessel, includes a penetration body including first and second ends to be positioned, respectively, inside and outside the vessel; a sealed electrical connector providing a first seal for the electrical penetration assembly, the sealed connector insulating the penetration body at the first end; a feed-through carrier flange having a plurality of unitary electrical feed-throughs, each unitary feed-through allowing a single electrical conductor to pass therethrough, thereby ensuring continuity of the electrical connections, each unitary feed-through being individually insulated by an individual insulator providing a second seal, the unitary feed-throughs insulating the penetration body at the second end; and an anti-ejection device formed by the engagement between a
(Continued)

narrowed portion provided at each unitary feed-through and a shoulder that is larger than the narrowed portion and provided on each of the electrical conductors.

15 Claims, 3 Drawing Sheets

(51) Int. Cl.
*G21C 13/028* (2006.01)
*G21C 1/32* (2006.01)

(56) References Cited

U.S. PATENT DOCUMENTS

| | | | | |
|---|---|---|---|---|
| 3,803,531 | A * | 4/1974 | Sorensen | G21C 17/116 |
| | | | | 439/190 |
| 3,856,983 | A * | 12/1974 | Fisher | G21C 17/116 |
| | | | | 174/151 |
| 4,107,456 | A * | 8/1978 | Schuster | G21C 17/116 |
| | | | | 174/11 R |
| 4,168,394 | A | 9/1979 | Yuey | |
| 4,235,674 | A * | 11/1980 | Yue | G21C 17/116 |
| | | | | 376/203 |
| 4,255,616 | A * | 3/1981 | Liotino | H01B 17/26 |
| | | | | 174/151 |
| 4,420,456 | A * | 12/1983 | Nickel | G21C 17/116 |
| | | | | 174/151 |
| 2013/0287157 | A1* | 10/2013 | Conway | G21C 17/116 |
| | | | | 376/203 |
| 2013/0301777 | A1* | 11/2013 | Berthold | G21C 17/116 |
| | | | | 376/228 |
| 2014/0198891 | A1 | 7/2014 | Harkness et al. | |

* cited by examiner

ELECTRICAL PENETRATION ASSEMBLY FOR A NUCLEAR REACTOR VESSEL

CROSS-REFERENCE TO RELATED APPLICATIONS

This is the U.S. National Stage of PCT/EP2016/065021, filed Jun. 28, 2016, which in turn claims priority to French Patent Application No. 1556144, filed Jun. 30, 2015, the entire contents of all applications are incorporated herein by reference in their entireties.

TECHNICAL FIELD OF THE INVENTION

The invention relates to the field of EPA (Electrical Penetration Assemblies) going through nuclear reactor vessels.

The invention finds a particularly interesting application in the field of integrated nuclear reactors and SMR (Small & Modular Reactors) comprising numerous in-vessel actuators/sensors creating specific electrical penetration needs. An application in conventional pressurised reactors is possible as a replacement for thimbles.

PRIOR ART

These vessel electrical penetrations have to meet several criteria. They have to be rapidly demountable, supple in order to be compatible with differential expansions between the vessel and the internal organs, and have a significant useable diameter (of the order of several centimetres) in order to be compatible with the number and the power of the electrical connections that need to be ensured in the vessel.

A first known solution consists in installing within the vessel a dedicated and demountable instrumentation flange encompassing the numerous thimbles required for an SMR to enable their removal in a single operation. Such a solution is described notably in the documents U.S. 20130287157 and U.S. 2014198891. The defect of this solution is the considerable increase in the development of the extension of the second containment barrier, not just for the thimbles but also for the sensors/actuators. Such an architecture thus has the consequences of: increasing the risks of leakage, multiplying the zones and the parts subjected to design, manufacture, inspection and in-service control regulations.

In order not to add any extension of the second containment barrier, other proposed solutions consist in transposing existing architectures and technologies of penetrations of reactor containment envelope using hermetic connections as proposed in the document WO 2013/158697. Indeed, the hermetic electrical feed-through technologies implemented for reactor containment envelope penetrations, such as prestressed vitroceramic or brazed ceramic technologies for example, withstand the temperature and pressure stresses of the primary fluid.

Nevertheless, the design constraints and requirements required for containment envelope penetrations, situated on the third containment barrier which are uniquely placed under pressure and temperature load during an accident, are less demanding than the design constraints and requirements required for reactor vessel penetrations which are permanently placed under pressure and temperature load by the primary fluid and the failure of which is an initial cause of critical incident, or even accident (depending on the equivalent leakage diameter in the event of failure).

Consequently, it is not obvious for those skilled in the art to transpose all existing and known solutions for containment envelope electrical penetrations to vessel electrical penetrations because they remain insufficient in terms of safety.

In particular, known electrical penetrations based on prestressed vitroceramic or brazed ceramic technology to produce a seal and an electrical insulation do not respect the characteristic required for materials used in the second containment barrier. Indeed, second barrier materials must have particular ductility and toughness characteristics, Yet the non-ductile and brittle character of glass, vitroceramic or ceramic makes their direct use difficult on the perimeter of the second regulatory barrier under primary pressure, contrary to what is suggested in the document WO 2013/158697.

Indeed, in the field of integrated reactors and small modular reactors (SMR), it is an objective to reduce, from the design stage, the causes of important breaks. Consequently those skilled in the art seeking to produce vessel electrical penetrations according to these criteria would have no incentive to use connectors made of glass, vitroceramic or ceramic directly, even though these technologies comply with the pressure/temperature requirements of the primary liquid, because the sudden failure of an electrical feed-through of a significant diameter (typically between 30 mm and 50 mm diameter for an electrical connection with twenty or so contact points) using a sealed connector made of glass, vitroceramic or ceramic in permanent contact with the primary fluid would be contrary to the spirit of the regulations applicable to the second containment barrier of a pressured water reactor.

DESCRIPTION OF THE INVENTION

In this context, the invention aims to propose an electrical penetration assembly for a nuclear reactor vessel that makes it possible to avoid an extension of the second containment barrier and that makes it possible to respect the spirit of the design regulations imposed in the field of pressurised reactors and SMR in particular, namely the prevention of primary leaks and the limitation of the consequences of potential failures.

To this end, the invention relates to an electrical penetration assembly for a nuclear reactor vessel that can be mounted in an aperture of a nuclear reactor vessel, said electrical penetration assembly comprising:

a penetration body comprising:
  a first end suitable for being positioned inside the vessel;
  a second end suitable for being positioned outside the vessel;
a sealed electrical connector forming a first seal for the electrical penetration assembly, said sealed electrical connector hermetically sealing the penetration body at the first end;
a feed-through carrier flange comprising a plurality of unitary electrical feed-throughs, each unitary electrical feed-through allowing a single electrical conductor to pass therethrough thereby ensuring the continuity of the electrical connections, each unitary electrical feed-through being individually insulated by an individual insulator forming a second seal for the electrical penetration assembly, said unitary electrical feed-throughs hermetically sealing the penetration body at the second end;
an anti-ejection device formed by the engagement between a narrowed portion provided at each unitary electrical feed-through and a shoulder that is larger in size than the narrowed portion of each unitary electrical feed-through and provided on each of the electrical conductors of said unitary feed-throughs.

The electrical penetration assembly according to the invention may also have one or more of the characteristics below taken individually or according to any technically possible combinations thereof:
- the electrical penetration assembly comprises means for making the electrical penetration assembly integral, in a leak-tight manner, with the outside of said reactor vessel;
- said individual insulators are insulators made of ceramic or prestressed vitroceramic;
- said sealed electrical connector is an electrical connector having an insulator made of ceramic or an insulator made of prestressed vitroceramic;
- the material of the insulator of the sealed electrical connector is different from the material providing the individual insulators;
- the electrical penetration assembly comprises means for detecting a leak-tightness failure of the unitary feed-throughs;
- the electrical penetration body is pressurised by an inert gas and in that the means for detecting a leak-tightness failure are formed by a detection device detecting an increase in pressure downstream of the unitary feed-throughs; advantageously, the penetration body is under an inert gas pressure of the order of 1 to 10 MPa;
- the penetration body comprises at least one rigid part and one flexible part capable of deforming at least along one direction;
- the electrical penetration assembly comprises means for limiting the leakage rate in the event of failure of the sealed electrical connector combined with the failure of at least one individual insulator;
- the electrical penetration assembly comprises a first means for limiting the leakage rate, in the event of failure of the sealed electrical connector combined with the failure of at least one individual insulator, formed by said anti-ejection device provided at each of the unitary electrical feed-throughs;
- the electrical penetration assembly comprises a second means for limiting the leakage rate, in the event of failure of the sealed electrical connector and of several unitary electrical feed-throughs, formed by a plurality of unitary ducts provided inside the penetration body, each unitary duct being suitable for allowing a single electrical conductor to pass therethrough going through said penetration body.

The invention also relates to a nuclear reactor vessel characterised in that it comprises at least one electrical feed-through according to the invention.

The invention also relates to a nuclear reactor characterised in that it comprises a vessel according to the invention.

Advantageously, said nuclear reactor is an integrated reactor or a small modular reactor.

Advantageously, said nuclear reactor comprises means for detecting a leak-tightness failure of the sealed electrical connector by control of the insulation of the electrical conductors with respect to earth.

BRIEF DESCRIPTION OF THE FIGURES

Other characteristics and advantages of the invention will become clear on reading the description that follows, with reference to the appended figures.

In all the figures, common elements bear the same references, unless stated otherwise.

The terms upstream and downstream used in the patent application are defined by considering the direction of flow of the primary fluid in the event of leakage, that is to say from the inside to the outside of the vessel 10.

DETAILED DESCRIPTION OF AN EMBODIMENT

Figure 1:
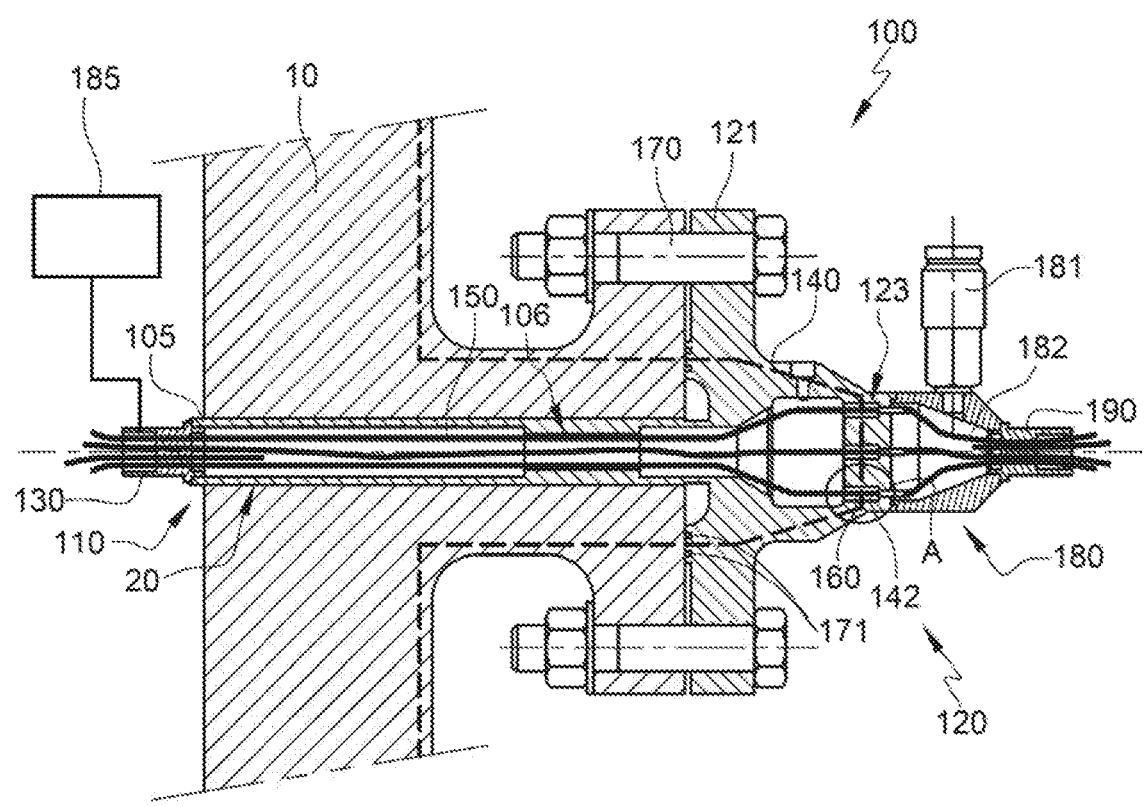
FIG. 1 illustrates a sectional view of part of a nuclear reactor vessel comprising a first embodiment of a vessel electrical penetration assembly according to the invention.

FIG. 1 illustrates a sectional view of a first embodiment of an electrical feed-through 100 according to the invention mounted in an aperture 20 of a vessel 10 of a nuclear reactor, of integrated or instead SMR type.

The vessel electrical penetration assembly (V-EPA) 100 according to the invention comprises a penetration body 105 substantially of cylindrical shape having a first end 110, designated inner end, intended to be positioned inside the nuclear reactor vessel 10 and a second end 120, designated outer end, intended to be positioned outside the reactor vessel 10.

A sealed connector 130 is made integral, for example by means of a leak-tight weld, at the inner end 110 of the penetration body 105 subjected to the pressure and temperature conditions of the primary liquid. This sealed connector 130 thereby forms a first seal for the penetration 100.

The diameter of the connector 130 and the number of pins constituting it is set by the functional need (i.e. as a function of the necessary number of wires and insulations). The sealed connector 130 used in an integrated nuclear reactor typically has a diameter comprised between 30 mm and 50 mm. The sealed connector 130 is a connector certified to withstand the primary conditions, including without the presence of the abuttal, i.e. the sensor or the actuator normally connected, but is not subjected to the regulations applicable to second barrier devices.

The outer end 120 of the electrical penetration 100 comprises a feed-through carrier flange 140 comprising a plurality of unitary feed-throughs 123 in which a plurality of electrical conductors 160, such as pins, are individually insulated by an insulator 142 made of vitroceramic or ceramic. The feed-through carrier flange 140 thus constitutes a second seal for the electrical penetration assembly 100.

The outer end 120 of the electrical penetration 100 further comprises a leakage and connection detection cell 180 integrally connected (for example by welding) to the outer end of the feed-through carrier flange 140. The leakage and connection detection cell 180 also enables the mounting of a standard connector 190 ensuring the electrical connection outside the vessel 10. In an identical manner to the sealed connector 130, the sealed standard connector 190 is made integral, for example by means of a leak-tight weld, with the outer end of the detection and connection cell 180.

The penetration body 105 also encloses a plurality of electrical cables 150 ensuring the electrical connection between the pins of the sealed connector 130 on the one hand (forming the first seal for the penetration assembly 100) and the electrical connectors 160 individually insulated by an insulator 142 situated at the feed-through carrier flange 140 (forming the second seal for the penetration assembly). The electrical cables 150 inside the penetration body are thereby made non-demountable. The electrical cables 150 are for example mineral cables certified for the temperature conditions of the primary fluid.

Inside the penetration body 105 is provided a plurality of unitary ducts 106 (three ducts being represented in FIG. 1), each of the unitary ducts 106 allowing a single electrical cable 150 to pass therethrough. Such unitary ducts 106 provided inside the penetration body 105 advantageously make it possible to limit the leakage rate of primary liquid in the event of total failure of all of the hermetic lines (i.e. connector 130 and unitary feed-throughs 123).

The electrical penetration assembly 100 comprises means for ensuring the mechanical maintaining thereof on the vessel 10. Advantageously, the means ensuring mechanical maintaining are formed by an end plate 121 arranged at the second end 120 of the penetration body 105, thereby forming a maintaining flange thereby making it possible to make the electrical penetration assembly 100 integral via the outside of the vessel 10. To this end, the end plate 121 engages with fastening elements 170 and at least one ring joint 171 making it possible to make the electrical penetration assembly 100 integral, in a leak-tight manner, with the vessel 10. In the embodiment illustrated in FIG. 1, the end plate 121 ensuring the maintaining and the feed-through carrier flange 140 form a one-piece part. Nevertheless, it is envisaged to be able to form these two elements separately.

Thus, the electrical penetration assembly 100 proposed by the invention aims to uncouple the connection function from the "second containment barrier function", by shifting the design requirements linked to the elements constituting the second containment barrier onto the feed-through carrier flange 140 and quite particularly onto the particular design of the unitary feed-throughs 123.

Such an architecture thereby makes it possible to have a sealed connector 130 subjected to the conditions of the primary liquid (i.e. the temperature and pressure conditions of the primary liquid) without nevertheless meeting the design and manufacturing regulations for elements constituting the second containment barrier, which makes it possible to use advantageously a sealed connector of simple design, easy to connect and/or to disconnect, and to avoid periodic inspection of this sealed connector 130, as well as the whole of the link up to the sensor/actuator, which is difficult to access because situated inside the vessel 10.

Indeed, the continuity of the second containment barrier, illustrated in FIG. 1 by the dotted line referenced BS, is ensured by the feed-through carrier flange 140 which respects the principles that will be explained hereafter in order to compensate the non-ductility of the materials used for the hermetic insulating feed-through.

Figure 2:
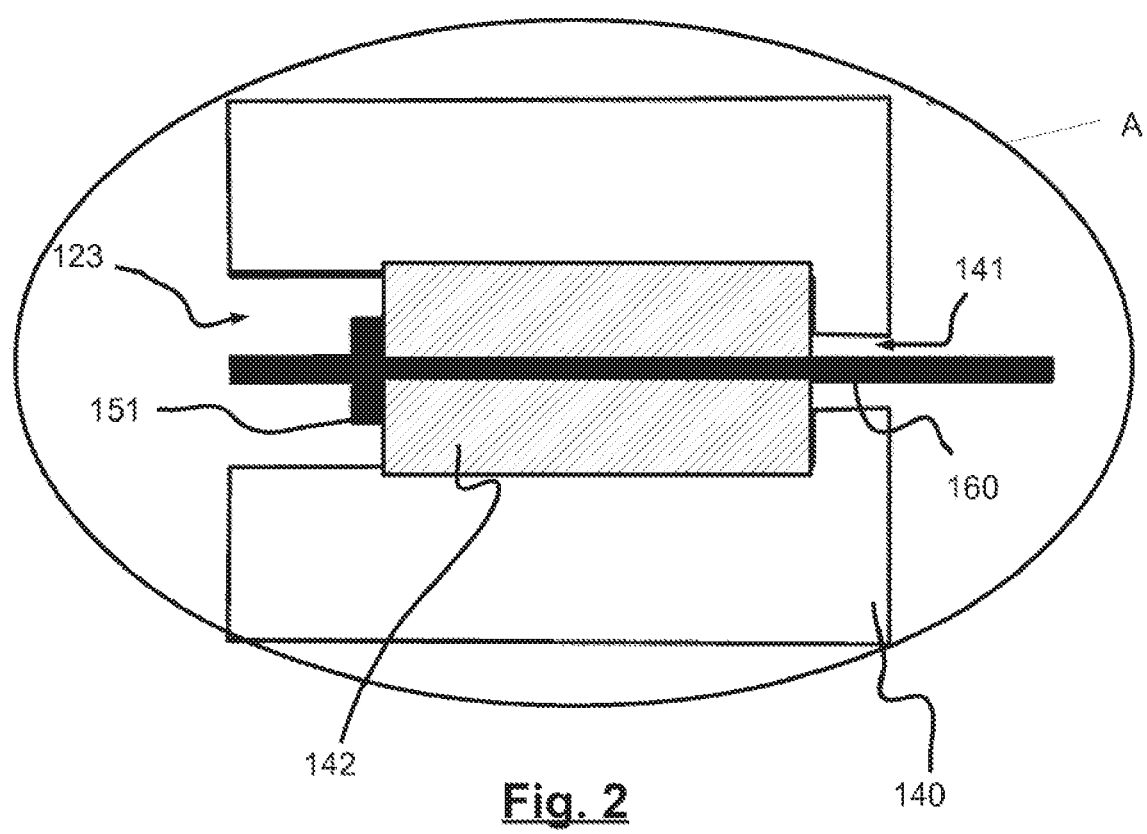
FIG. 2 illustrates in a more detailed manner a unitary feed-through of the vessel electrical penetration assembly illustrated in FIG. 1.

As illustrated in FIG. 2, each unitary feed-through 123 of the feed-through carrier flange 140 has at its outer end a narrowed portion 141 which also makes it possible to limit the leakage rate of the electrical penetration 100 in the event of failure at a unitary feed-through 123, combined with a failure of the connector 130 so as to meet safety criteria.

The electrical penetration assembly 100 according to the invention comprises an anti-ejection system making it possible to avoid any ejection of the pins 160 or cables 150 situated inside the penetration body 105. This anti-ejection system is formed by the presence of a shoulder 151 at each electrical conductor 160 of the unitary feed-throughs 123 of the feed-through carrier flange 140. Each shoulder 151 engages with a narrowed portion 141 while ensuring the non-ejection of the pin 160 or the cable 150 even with complete destruction of an insulator 142 coupled with leakage of the sealed connector 130. To do so, the dimensions of the shoulders 151 at the feed-throughs 123 are greater than the dimensions, and notably the diameter, of the narrowed portion 141 at the outlet of the feed-throughs 123.

Advantageously, the materials used to achieve the leak-tightness of the sealed connector 130 of the first seal and the unitary insulators 142 forming the second seal are different. Thus, for example, it is possible to use an insulating connector 130 with ceramic technology and unitary insulators 142 using prestressed vitroceramic technology. The diversity of materials makes it possible to improve the justification of the design vis-à-vis common mode failures.

The electrical penetration assembly 100 also comprises a detection means 185 capable of detecting a leak-tightness failure of the inner sealed connector 130 and/or of its mechanical connection to the penetration body 105. The detection means 185 control the permanent insulation of the electrical connections with respect to earth. The failure of the inner sealed connector 130 results in an invasion of the penetration body with primary liquid, which would bring about the loss of insulation of the electrical connections.

The electrical penetration assembly 100 also comprises a detection means making it possible to detect a leak-tightness failure of at least one unitary feed-through 123 of the feed-through carrier flange 140. The detection means are formed by the cooperation of the initial pressurisation of the penetration body 105 and a pressure detector 181 ending in an inner chamber 182 of the leak and connection detection cell 180.

Thus, the pressure detector 181 detects all pressure rises inside this inner chamber 182 reflecting a loss of hermeticity of a unitary feed-through 123. The penetration body 105 is advantageously pressurised during design with an inert gas (for example nitrogen), typically under a pressure of 1 MPa to 10 MPa.

Thus, thanks to the architecture of the electrical penetration assembly 100 according to the invention, and unlike the prior art, the failure of the inner sealed connector 130 does not lead to a breach of the primary liquid. This is enabled by the presence of a double hermeticity, by the presence of means for detecting a leak-tightness failure of the electrical penetration assembly 100 and by the presence of individually insulated electrical feed-throughs 123 having an architecture ensuring the non-ejection of the conductor in the event of failure of the unitary insulator 142. In addition, the individual character of the unitary feed-throughs 123 also makes it possible to limit the consequences of their potential failure by limitation of the primary leakage diameter at the outlet of the electrical penetration 100 (typically less than 10 mm diameter) in such a way as to meet safety requirements and to make it possible to ensure continuity of the second containment barrier.

The different components of the electrical penetration assembly 100 described previously are assembled in an indissociable manner (for example by welding) to constitute a one-piece electrical penetration.

Figure 3:
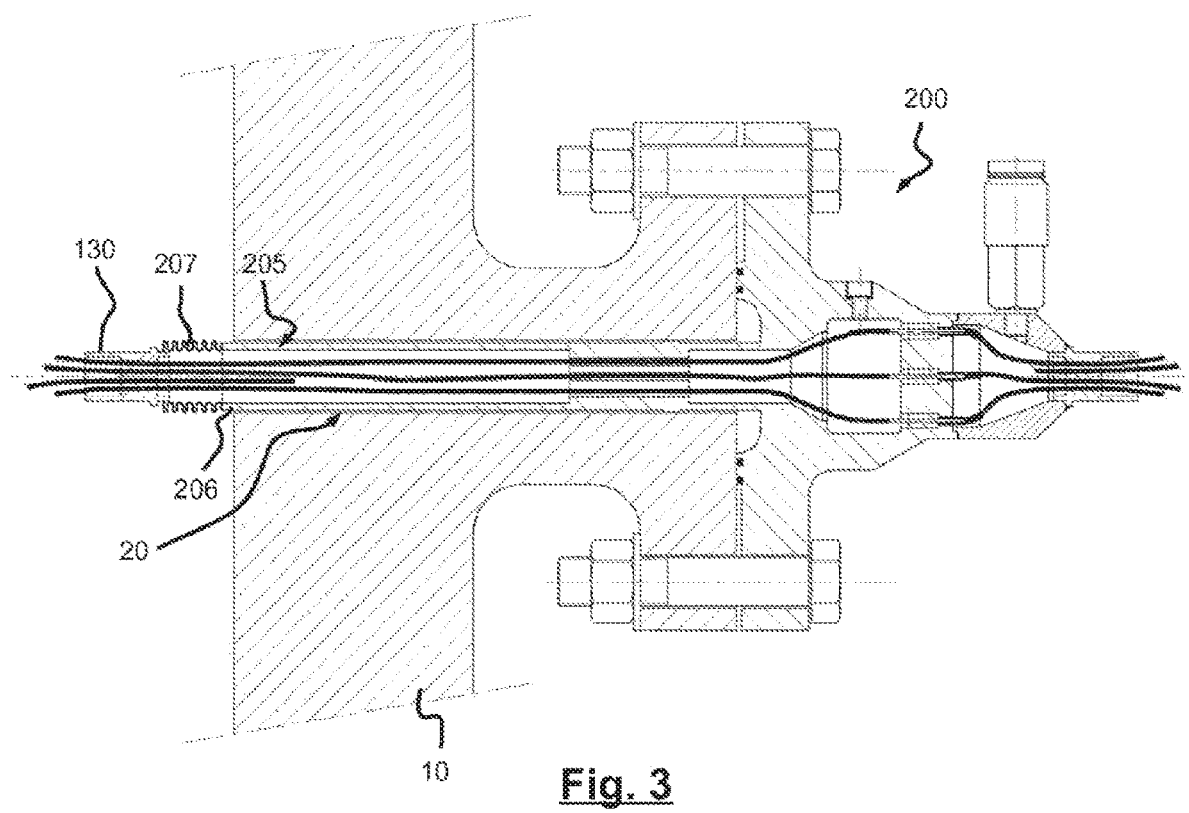
FIG. 3 illustrates a sectional view of part of a nuclear reactor vessel comprising a second embodiment of a vessel electrical penetration assembly according to the invention.

FIG. 3 illustrates a second embodiment of an electrical feed-through 200 of a nuclear reactor vessel according to the invention.

This embodiment is identical to the first embodiment described previously with the exception that will be described hereafter.

In this second embodiment, the penetration body 205 has a rigid part 206 at the aperture 20 of the vessel and a supple or more exactly flexible (for example in the longitudinal direction of the feed-through 200) part 207 enabling a coming up against an abuttal and the compensation of differential expansions. In an identical manner to the first embodiment described above, the flexible part 207 is not considered to be situated on the second regulatory containment barrier.

The invention has been particularly described by making the electrical penetration assembly integral via the outside of the vessel 10. Nevertheless, it is also envisaged to make the electrical penetration assembly according to the invention integral via the inside of the vessel 10.

The invention claimed is:

1. An electrical penetration assembly for a nuclear reactor vessel that can be mounted in an aperture of a nuclear reactor vessel, said electrical penetration assembly comprising:
    a penetration body comprising:
        a first end configured to be positioned inside the vessel;
        a second end configured to be positioned outside the vessel;
    a sealed electrical connector forming a first seal for the electrical penetration assembly, said sealed electrical connector hermetically sealing the penetration body at the first end;
    a feed-through carrier flange at the second end of the penetration body comprising a plurality of unitary electrical feed-throughs, each unitary electrical feed-through allowing a single electrical conductor to pass therethrough thereby ensuring the continuity of the electrical connections, each unitary electrical feed-through having a narrowed portion at an outer end and being individually insulated by an individual insulator forming a second seal for the electrical penetration assembly, said unitary electrical feed-throughs hermetically sealing the penetration body at the second end, each of the electrical conductors having a shoulder provided thereon that is larger in size than the narrowed portion, and said individual insulator being provided between the narrowed portion and the shoulder;
    an anti-ejection device formed by the engagement between the narrowed portion provided at each unitary electrical feed-through and the shoulder that is provided on each of the electrical conductors of said unitary feed-throughs.

2. The electrical penetration assembly for a nuclear reactor vessel according to claim 1, further comprising means for making the electrical penetration assembly integral, in a leak-tight manner, with the outside of said reactor vessel.

3. The electrical penetration assembly for a nuclear reactor vessel according to claim 1, wherein said individual insulators are insulators made of ceramic or prestressed vitroceramic.

4. The electrical penetration assembly for a nuclear reactor vessel according to claim 3, wherein said sealed electrical connector is an electrical connector having an insulator made of ceramic or an insulator made of prestressed vitroceramic.

5. The electrical penetration assembly for a nuclear reactor vessel according to claim 4, wherein the material of the insulator of the sealed electrical connector is different from the material forming the individual insulators.

6. The electrical penetration assembly for a nuclear reactor vessel according to claim 1, further comprising means for detecting a leak-tightness failure of the unitary feed-throughs.

7. The electrical penetration assembly for a nuclear reactor vessel according to claim 6, wherein the electrical penetration body is pressurised by an inert gas and wherein the means for detecting a leak-tightness failure are formed by a detection device detecting an increase in pressure downstream of the unitary feed-throughs.

8. The electrical penetration assembly for a nuclear reactor vessel according to claim 1, wherein the penetration body comprises, at the first end thereof, at least one rigid part at the aperture and one flexible part adjacent to the sealed electrical connector that is capable of deforming at least along one direction.

9. The electrical penetration assembly for a nuclear reactor vessel according to claim 1, wherein the narrowed portion of each of the unitary electrical feed-throughs and the shoulder are further configured for limiting a leakage rate of liquid upon engagement, in the event of failure of the sealed electrical connector combined with the failure of at least one individual insulator.

10. The electrical penetration assembly for a nuclear reactor vessel according to claim 1, wherein the electrical penetration assembly further comprises a plurality of unitary ducts provided inside the penetration body between the first end and the second end thereof, each unitary duct being suitable for allowing a single electrical conductor to pass therethrough for going through said penetration body.

11. The electrical penetration assembly for a nuclear reactor vessel according to claim 1, wherein the second end of the penetration body further comprises a leakage and connection detection cell connected to an outer end of the feed-through carrier flange and a sealed connector provided at the second end of the penetration body.

12. A nuclear reactor vessel comprising at least one electrical feed-through according to claim 1.

13. The a nuclear reactor vessel according to claim 12, further wherein the feed-through carrier flange is part of an end plate arranged at the second end of the penetration body, and wherein the end plate engages the nuclear reactor vessel via fastening elements and at least one ring joint.

14. A nuclear reactor comprising a vessel according to claim 12.

15. The nuclear reactor according to claim 14, wherein said nuclear reactor is an integrated reactor or a small modular reactor.

* * * * *